United States Patent
Sahu et al.

(10) Patent No.: US 9,928,898 B2
(45) Date of Patent: Mar. 27, 2018

(54) WORDLINE ADJUSTMENT SCHEME

(71) Applicant: QUALCOMM Incorporated, San Diego, CA (US)

(72) Inventors: Rahul Sahu, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/085,942

(22) Filed: Mar. 30, 2016

(65) Prior Publication Data
US 2017/0287551 A1  Oct. 5, 2017

(51) Int. Cl.
| | | |
|---|---|---|
| G11C 16/08 | (2006.01) | |
| G11C 11/419 | (2006.01) | |
| G11C 11/412 | (2006.01) | |
| G11C 11/418 | (2006.01) | |
| G11C 8/08 | (2006.01) | |
| G11C 11/413 | (2006.01) | |
| G11C 16/30 | (2006.01) | |

(52) U.S. Cl.
CPC .............. *G11C 11/419* (2013.01); *G11C 8/08* (2013.01); *G11C 11/412* (2013.01); *G11C 11/413* (2013.01); *G11C 11/418* (2013.01); *G11C 16/08* (2013.01); *G11C 16/30* (2013.01)

(58) Field of Classification Search
CPC ............ G11C 16/08; G11C 8/08; G11C 16/30
USPC .................. 365/185.23, 230.06, 154, 189.05
See application file for complete search history.

(56) References Cited

U.S. PATENT DOCUMENTS

| | | | | |
|---|---|---|---|---|
| 5,410,508 A | * | 4/1995 | McLaury ................ | G11C 8/08 365/189.09 |
| 9,001,579 B2 | | 4/2015 | Song et al. | |
| 9,202,579 B2 | | 12/2015 | Hsiung et al. | |
| 2006/0274569 A1 | * | 12/2006 | Joshi ................... | H01L 27/1104 365/154 |
| 2007/0030741 A1 | | 2/2007 | Nii et al. | |
| 2008/0037358 A1 | * | 2/2008 | Yabuuchi ............... | G11C 5/147 365/230.06 |
| 2012/0033522 A1 | | 2/2012 | Chuang et al. | |
| 2012/0075918 A1 | | 3/2012 | Arsovski et al. | |

(Continued)

FOREIGN PATENT DOCUMENTS

CN   104934068 A   9/2015

OTHER PUBLICATIONS

International Search Report and Written Opinion—PCT/US2017/019488—ISA/EPO—dated Jun. 13, 2017.

*Primary Examiner* — Jason Lappas
(74) *Attorney, Agent, or Firm* — Arent Fox LLP

(57) ABSTRACT

A memory and a method for operating a memory are provided. The memory includes a memory cell having a transistor and a wordline driver outputting a wordline coupled to the memory cell. The wordline driver adjusts a voltage level of the wordline to compensate for a parameter of the transistor. The method includes asserting a wordline voltage to access a memory cell having a transistor and adjusting the wordline voltage to compensate for a parameter of the transistor. Another memory is provided. The memory includes a memory cell and a wordline driver outputting a wordline coupled to the memory cell. The wordline driver adjusts a voltage level of the wordline based on a feedback of the wordline.

29 Claims, 8 Drawing Sheets

(56) References Cited

U.S. PATENT DOCUMENTS

2012/0106237 A1* 5/2012 Dengler ................ G11C 5/145
                                                          365/154
2014/0022835 A1   1/2014 Hold et al.
2014/0112065 A1   4/2014 Tanabe
2015/0029799 A1   1/2015 Schreiber

* cited by examiner

WORDLINE ADJUSTMENT SCHEME

BACKGROUND

Field

The present disclosure relates generally to electronic circuits, and more particularly, to a memory with an improved wordline adjustment scheme.

Background

Memory is a vital component for wireless communication devices. For example, the memory may be integrated as part of an application processor in a cell phone. With the ever increasing demands for more processing capability in these wireless communication devices, low power consumption has become a common design requirement. Various techniques are currently employed to reduce power consumption in such devices. One such technique involves reducing the operating voltage of the memories.

However, operating the memories at a low voltage may exacerbate the issue of static noise margin (SNM). The SNM is understood to be a maximum amount of voltage noise a memory cell can withstand without disturbing the stored data. The minimum operating voltage may thus be limited by the SNM. Accordingly, one design challenge is to address the SNM issue to allow even lower memory operating voltage.

SUMMARY

Aspects of a memory are disclosed. The memory includes a memory cell having a transistor and a wordline driver outputting a wordline coupled to the memory cell. The wordline driver is configured to adjust a voltage level of the wordline to compensate for a parameter of the transistor.

Aspects for operating a memory are disclosed, the method includes asserting a wordline voltage to access a memory cell having a transistor and adjusting the wordline voltage to compensate for a parameter of the transistor.

Further aspects of a memory are disclosed. The memory includes a memory cell and a wordline driver outputting a wordline coupled to the memory cell. The wordline driver is configured to adjust a voltage level of the wordline based on a feedback of the wordline.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
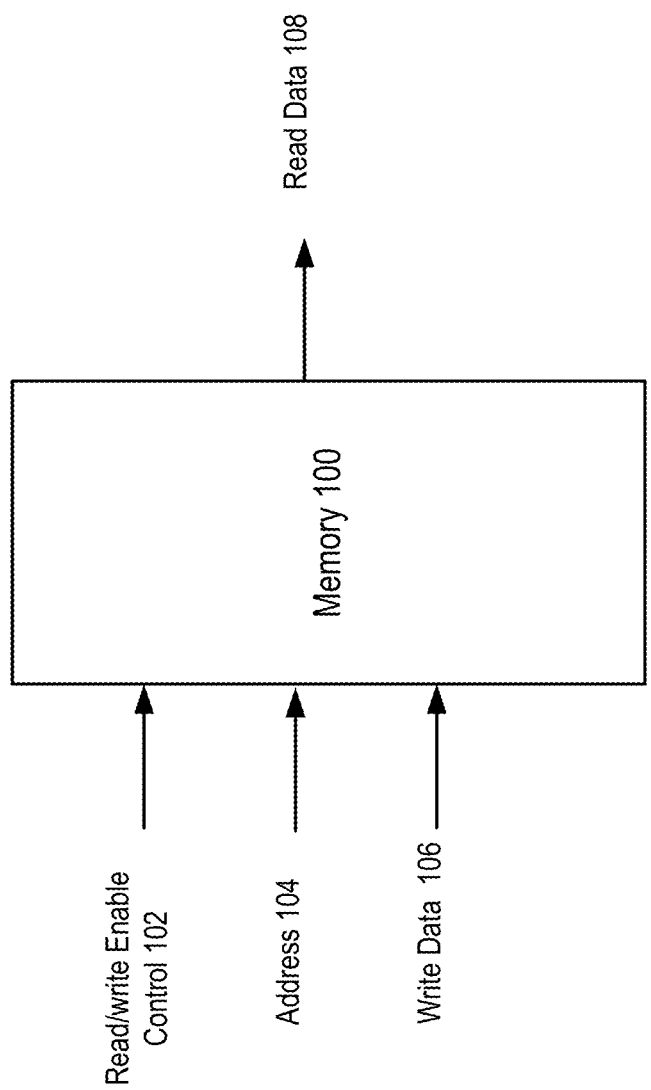
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for reading from and/or writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Accordingly, all references to the SRAM are intended only to illustrate exemplary aspects of the memory with the understanding that such aspects may be extended to a wide range of applications. In some examples, the described SRAM may be embedded with other integrated circuit (IC) blocks, such as processors, on a substrate. One such example of embedded SRAM is an application processor for wireless communication applications.

FIG. 1 is a block diagram of an exemplary embodiment of a memory 100. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for an operation control 102 for controlling an operation of the memory 100. For example, the memory 100 may operate in read, write, or various test modes. The memory 100 also includes inputs for the address (e.g., via the address input 104) and for write data (e.g., via the read data/write data 106) to be written to the memory 100 at the specified address. The memory further includes an output for read data (e.g., via the read data/write data 106) read from the memory 100 at the specified address. When writing data to the memory 100, a peripheral circuit sets the operation control 102 to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit.

Figure 2:
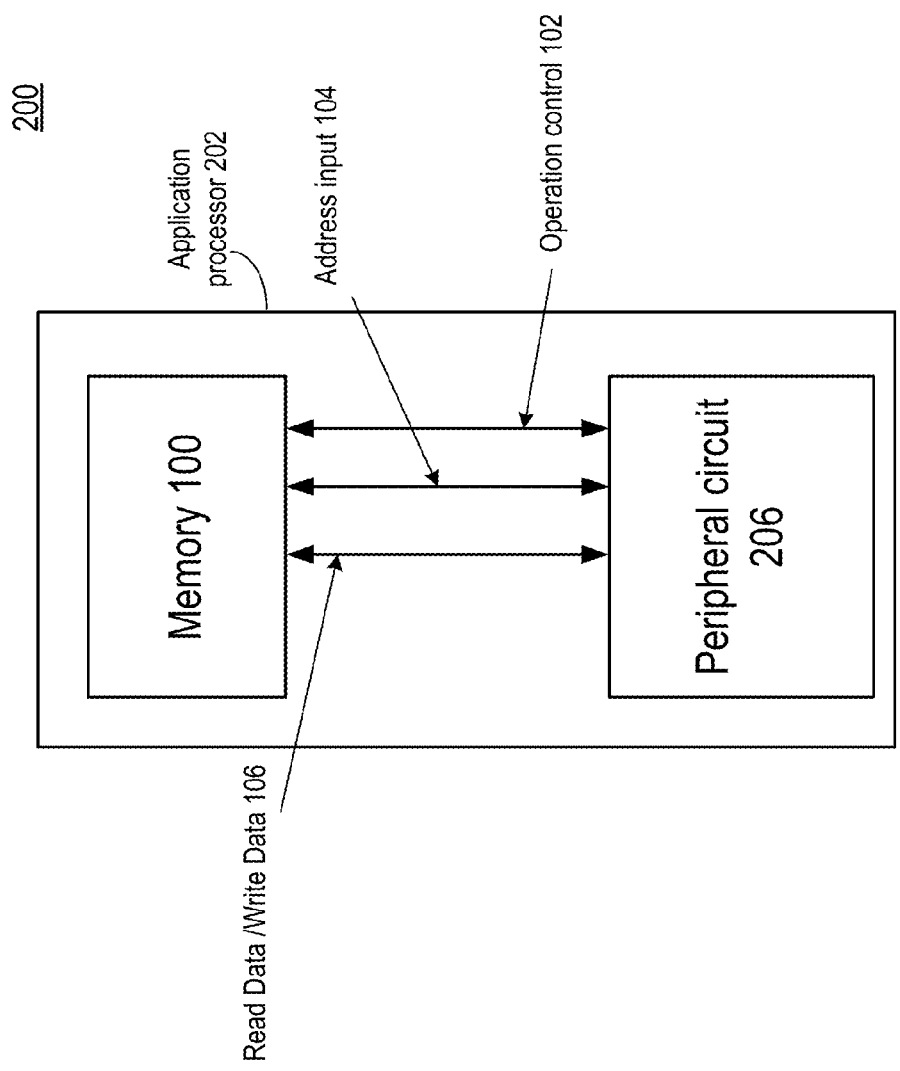
FIG. 2 is a block diagram of an exemplary embodiment of an application processor incorporating the memory of FIG. 1.

FIG. 2 is a block diagram of an exemplary embodiment of an application processor incorporating the memory of FIG. 1. The application processor 202 is provided as an example of an IC substrate having the memory 100 of FIG. 1 incorporated therein. As is known by a person of ordinary skill in the art, applications of the memory 100 are not limited thereto. In some examples, the application processor 202 may be incorporated in the IC substrate upon which the memory 100 and various processor cores are incorporated. A processor core may be a collection of circuits and may include an instruction execution unit. One of the processor cores may operate as or include the peripheral circuit 206. In some examples, the peripheral circuit 206 may be construed broadly to include any suitable circuit that is peripheral to the memory 100 and capable of accessing the memory 100. As described with FIG. 1, the peripheral circuit 206 may instruct the memory 100 to execute a read or write operation via the operation control 102 and the address input 104. The peripheral circuit 206 may further receive the read data from the memory 100 or provide the write data to the memory 100 via the read data/write data 106.

Figure 3:
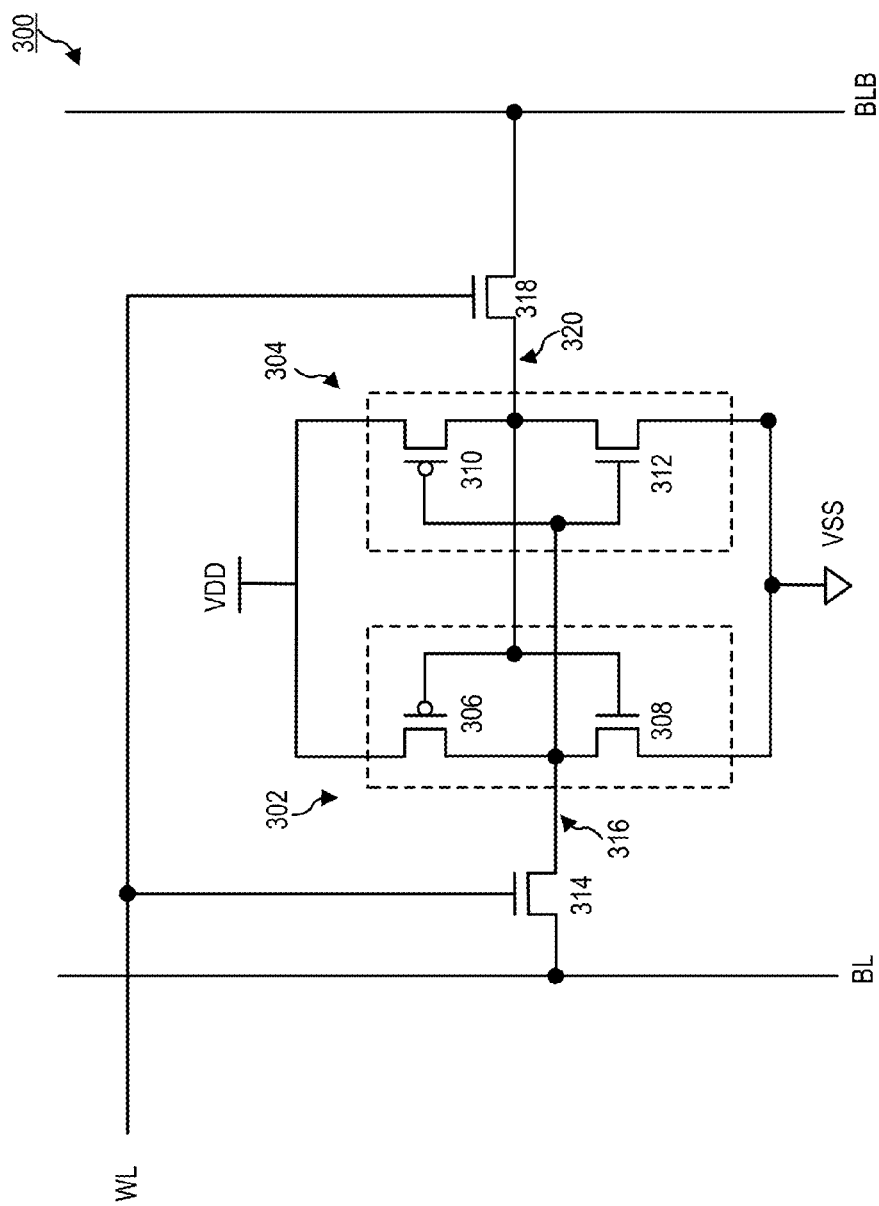
FIG. 3 is a schematic diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., logic 1 or logic 0). FIG. 3 is a circuit diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 includes a p-channel transistor 306 and an n-channel transistor 308. The second inverter 304 includes a p-channel transistor 310 and an n-channel transistor 312. In the described embodiment, the inverters 302 and 304 are powered by VDD and have a return VSS (e.g., ground). The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a predetermined level, which is determined so as not to disturb the stored data in the memory cell 300. (The charge circuit is not shown for clarity). The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., VDD) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference on the bitline pair BL and BLB is thus established by the pulling-down of the bitline BL.

The bitlines BL and BLB are fed to a sense amplifier (SA), which senses the data (e.g., voltage difference) carried thereon and outputs a logic level (e.g., logic 1) as the read data to the peripheral circuit 206. In the disclosure, a write operation is used as an example (but the score of the disclosure is certainly no limited thereto). According, the SA is not shown for clarity.

A write operation may be initiated by setting the bitlines BL and BLB to the value to be written to the memory cell 300 and asserting the wordline WL. That is, the write data are driven onto the bitlines BL and BLB. The wordline WL may be asserted before or after the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver is designed to be stronger than the pull-up transistors (306 and 310) in the memory cell 300 so that the write data can override the previous state of the cross-coupled inverters 302, 304.

Once the read or write operation is complete, the wordline is de-asserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Various aspects of apparatuses and methods to adjust a voltage level of a wordline will be presented with respect to a write operation of an SRAM. However, as those skilled in the art will readily appreciate, the various aspects of methods and apparatus to adjust a voltage level of a wordline presented throughout this disclosure and their numerous applications are not limited thereto. For example, the aspects presented may be applied to memories beyond the SRAM and beyond write operations. Accordingly, all references to a specific application for the presented apparatus or method are intended only to illustrate exemplary aspects of the apparatus or method with the understanding that such aspects may have a wide differential of applications.

Figure 4:
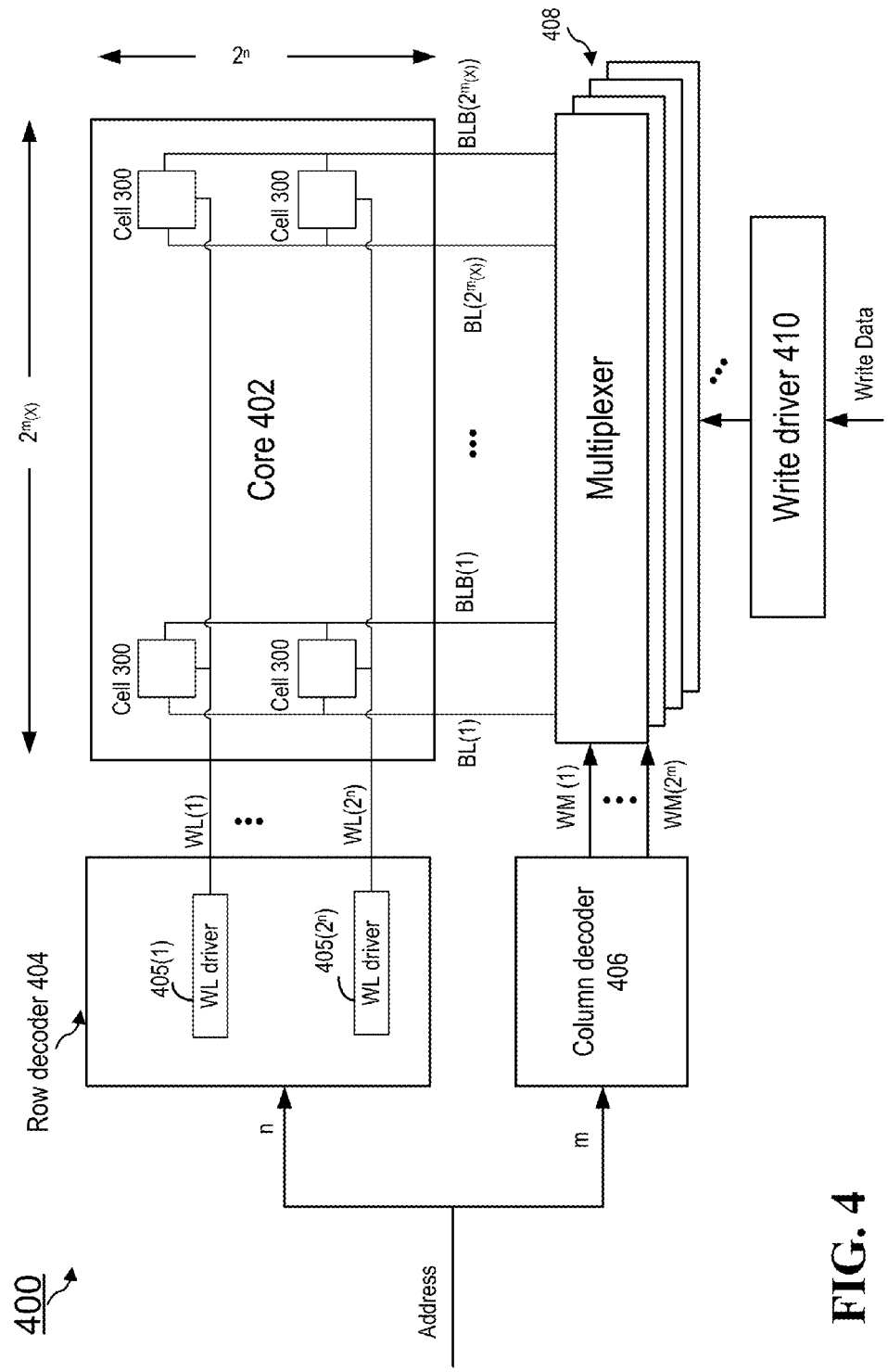
FIG. 4 is a functional block diagram of an exemplary embodiment of an SRAM.

FIG. 4 is a functional block diagram of an exemplary embodiment of an SRAM. Various aspects of an SRAM will now be presented in the context of a write operation. Accordingly, for clarity of presentation, only the connections for the write operation are shown. Those skilled in the art will readily appreciate that additional connections are required to support the read operation.

The SRAM 400 is configured to implement an improved scheme to adjust the voltage level on the wordline to, for example, improve SNM. The SRAM 400 includes a core 402 with supporting circuitry to decode addresses and perform read and write operations. The core 402 includes memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in T horizontal rows and $2^m(x)$ vertical columns, where $2^m$ is the number of words per row and x is the number of bits per word. A peripheral device (not shown) may randomly access any word (i.e., x cells) in the core 402 using an address that is (n+m) bits wide. In other words, the SRAM 400 outputs x-bits read data for a read operation, and writes x-bits write data into the core 402 for a write operation.

In this example, n-bits of the address are provided to the input of a row decoder 404 and m-bits of the address are provided to the input of a column decoder 406. The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines (BL and BLB) through its access transistors as described above in connection with FIG. 3. The row decoder 404 may include wordline drivers 405(1:$2^n$) to output a voltage level onto each of the WL wordlines. Features relating to the wordline drivers 405(1:$2^n$) are provided with FIG. 5. The write data is driven, through the x multiplexers 408, onto the selected pairs of bitlines (BL and BLB) and written to the memory cells with the asserted wordline WL, as described with FIG. 3.

The column decoder 406 provides $2^m$ outputs (WM1-WM$2^m$) with a different one of the outputs asserted for each different combination of address inputs. The outputs are provided to x multiplexers 408. Each multiplexer is $2^m$:1 multiplexer which switches one of x inputs from the write driver 410 between $2^m$ bitline pairs based on the outputs from the column decoder 406. By way of example, a core that stores four 128-bit words per row requires 128 4:1 multiplexers (e.g., x is four in this example). Each multiplexer input is coupled to one of 128 outputs from the write driver 410. Based on the decoded m-bit address, each multiplexer couples its input from the write driver 410 to one of four bitline pairs. The four bitline pairs are coupled to four memory cells, each storing a corresponding bit for a different word in a row. For example, the first of the four memory cells may store the least significant bit (LSB) of the first word, the second of the four memory cells may store the LSB of the second word, the third of the four memory cells may store the LSB of the third word, and the fourth of the four memory cells may store the LSB of the fourth word. Thus, the write driver 410 drives the write data received from the peripheral device (not shown) onto x pairs of bitlines BL and BLB with each of the x multiplexers providing one pair of bitlines BL and BLB.

Figure 5:
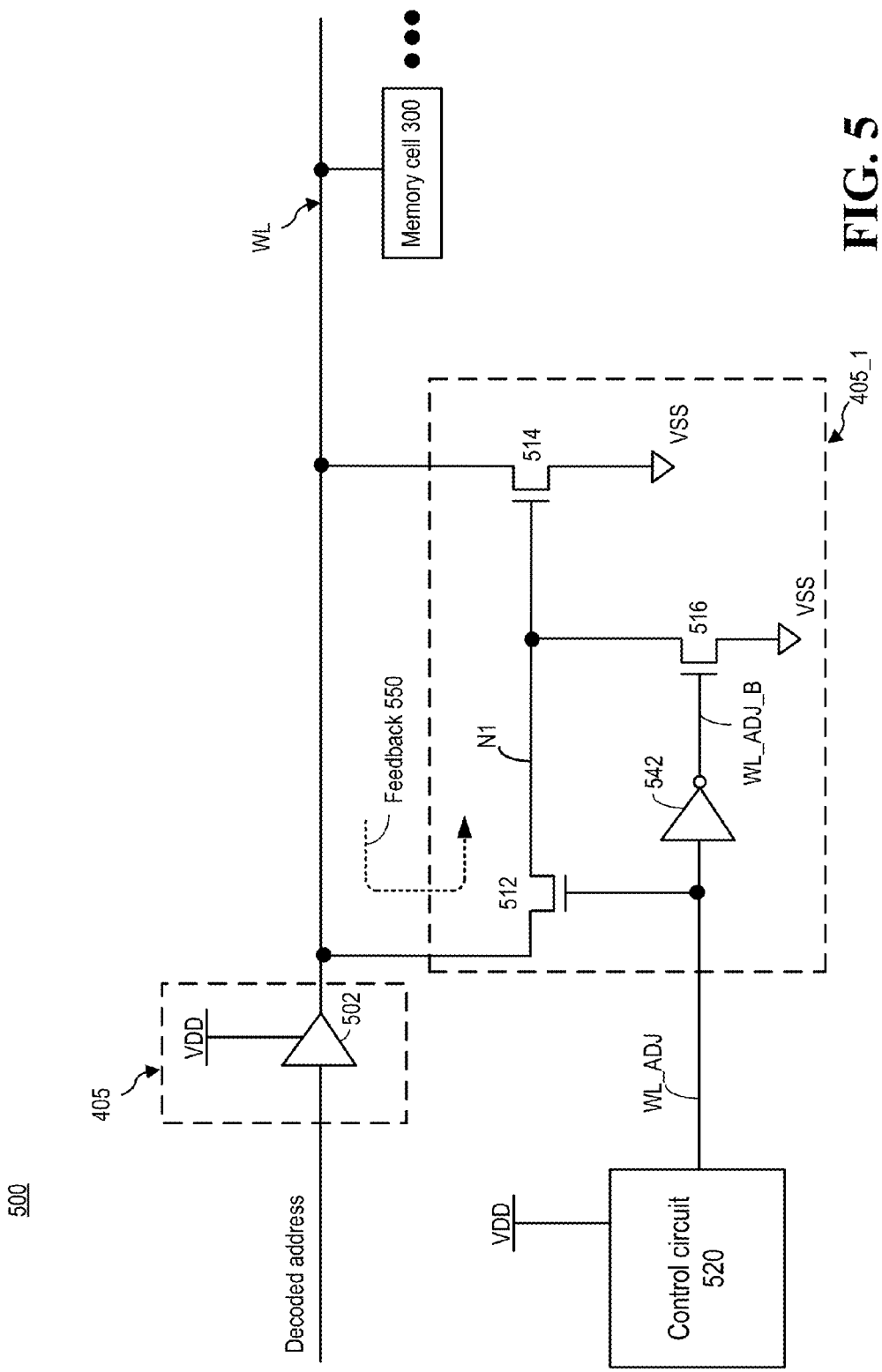
FIG. 5 is a circuit diagram of an exemplary embodiment of a write driver outputting and adjusting a voltage level of a wordline.

FIG. 5 is a circuit diagram of an exemplary embodiment of a write driver outputting and adjusting a voltage level of a wordline. One scheme to improve the SNM (and therefore further lowers the minimum operating voltage of the memory) is to adjust the wordline voltage. For example, the wordline voltage (e.g., a voltage level when the wordline WL is asserted to access the memory cell 300) may be adjusted lower to improve on the SNM for write. In some examples, as described with FIG. 4, the asserted wordline is coupled to $2^m(x)$ memory cells 300, among which x memory cells 300 may be selected for write. Thus, the selected x memory cells 300 are supplied with write data. The unselected memory cells 300 may be put in pseudo-read condition. For example, the bitline pair BL and BL_B for the unselected memory cell 300 may be precharged to a voltage level, such as VDD, that does not disturb the stored data upon an assertion of the wordline WL. The scheme is more susceptible to noise under certain conditions. For example, the unselected memory cell 300 may store a logic 0 at the node 316. In a write operation, the bitline pair BL and BL_B is charged to VDD for the unselected memory cell 300. Under some conditions, such as faster n-type transistor, the access transistor 314 may be stronger than normal, and noise may cause the VDD level on the bitline BL to overwrite, via the strong access transistor 314, the stored logic 0 at the node 316. Thus, in some examples (e.g., for write), the SRAM 400 is more susceptible to noise for a case of faster n-type transistor than a case of slower n-type transistor Thus, adjusting or lowering the wordline voltage may improve the SNM. As the voltage level of the wordline is lowered, the effect of faster n-type transistor may be mitigated. For example, the VDD on the bitline BL would not be able to falsely overwrite the stored logic 0 at the node 316 with the lowered wordline WL, as the drive of the access transistor 314 would be diminished by the lower wordline WL. However, other issues may arise. For example, under the condition of slower n-type transistor (and faster p-type transistor), overwriting the stored data in the selected memory cell 300 may be more difficult. Thus, adjusting or lowering the wordline may impact the write performance.

The circuit diagram 500 depicts an exemplary embodiment of a write driver 405 that improves the SNM for some conditions (e.g., faster n-type transistor) without degrading the write capability of memory cell for other conditions (e.g., slower n-type transistor) by the same level. The wordline driver 405 includes a buffer 502 powered by the voltage supply VDD and a voltage adjustment circuit 405_1. In some examples, the buffer 502 may include an inverter. The buffer 502, in response to the decoded n-bit address, outputs the wordline voltage at VDD onto the wordline WL.

The voltage adjustment circuit 405_1 is configured to adjust the wordline voltage by an adjustment amount $V_{ADJ}$ to compensate for a parameter of a (reference) transistor in the memory cell 300. Thus, in some examples, the adjustment amount $V_{ADJ}$ may vary in accordance or in response to the parameter of the (reference) transistor in the memory cell 300. In some examples, the (reference) transistor may be the access transistor 314 or 318. In some examples, the parameter may include the speed of the (reference) transistor. For example, a case of faster speed may include the (reference) transistor having a higher transconductance and/or lower threshold voltage $V_{TH}$, compared to a case of lower speed. In some examples, the parameter of the (reference) transistor may additionally take temperature into account.

The voltage adjustment circuit 405_1 includes an n-type pull-down transistor 514 coupled to the wordline WL. The pull-down transistor 514 is configured to adjust or pull down the wordline voltage on the wordline WL. In some examples, the pull-down transistor 514 is configured to pull down the voltage level on the wordline WL more in a case of faster sleep of n-type transistor than in a case of slower speed of the (reference) transistor (and pull down the wordline voltage less in a case of slower n-type transistor). The voltage adjustment circuit 405_1 further includes an n-type passgate transistor 512 to bias the pull-down transistor 514. The passgate transistor 512 couples the gate of the pull-down transistor 514 and the wordline WL to control the adjusting or pulling down of the wordline voltage. When the passgate transistor 512 is turned on, a feedback of the wordline 550 feeds back the wordline voltage level via the passgate transistor 512 and the pull-down transistor 514. In such state, the wordline WL is electrically connected to the gate of the pull-down transistor. The adjustment amount $V_{ADJ}$ is thus based on a present voltage level of the wordline WL. Accordingly, the wordline driver is configured to adjust a voltage level of the wordline WL based on a feedback of the wordline.

The adjustment amount $V_{ADJ}$ varies according to the parameter of the (reference) transistor of the memory cell 300. In some examples, voltage adjustment circuit 405_1 is configured such that the adjustment amount $V_{ADJ}$ is greater in a case of a faster speed than a case of slower speed of the (reference) transistor. In such fashion, the impact of adjusting or lowering the wordline voltage is reduced in the case of slower speed of the (reference) transistor.

For example, the (reference) transistor of the memory cell 300 may be the n-type transistor, such as the access transistor 314 or 318, of the memory cell 300. In the case of faster speed of n-type transistor, a higher adjustment amount $V_{ADJ}$ may be needed to improve the SNM (e.g., for write). As presented above, by lowering the wordline WL by the higher adjustment amount $V_{ADJ}$, the unselected memory cells 300 are less susceptible to noise (which otherwise might cause disturbance of the stored data due to the faster speed of the n-type access transistor 314 or 318).

In the case of slower speed of n-type transistor, a lower adjustment amount $V_{ADJ}$ may be applied. To write the memory cells 300, the write data on the bitline pairs BL and BL_B overcome the data stored in the memory cells 300. By reducing the adjustment amount $V_{ADJ}$ in the case of slower speed of n-type transistor, such write process is not impeded. Additional details regarding the operation of the voltage adjustment circuit 405_1 are presented with FIG. 6.

The voltage adjustment circuit 405_1 may further be configured to be disabled (e.g., does not adjust or pull down the wordline voltage). A control circuit 520 powered by the voltage supply VDD asserts the WL_ADJ signal to enable voltage adjustment circuit 405_1. The asserted WL_ADJ signal may thus be at VDD level and is provided to the gate of the passgate transistor 512 to turn on the passgate transistor 512. The inverter 542 receives the WL_ADJ signal and outputs the WL_ADJ_B signal, which is of the opposite polarity of the WL_ADJ signal. The n-type transistor 516 couples the node N1, which is connected to the gate of the pull-down transistor 514, and ground VSS. When the WL_ADJ signal is asserted, the n-type transistor 516 is turned off and does not affect the operation of the voltage adjustment circuit 405_1. When the WL_ADJ signal is de-asserted to disable the voltage adjustment circuit 405_1, the passgate transistor 512 to turn off by the WL_ADJ signal, and the transistor 516 is turned on by the WL_ADJ_B signal. The turned-on transistor 516 pulls the node N1 to ground to disable the pull-down transistor 514.

Figure 6:
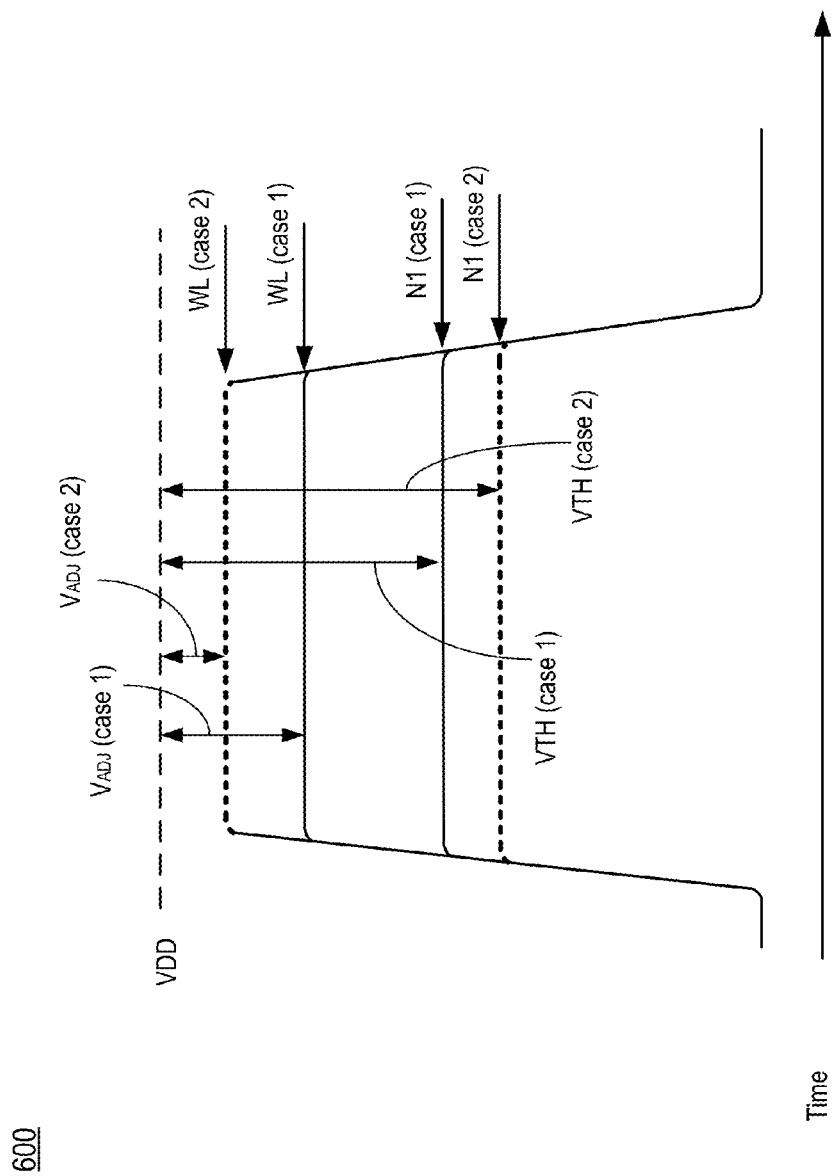
FIG. 6 is a diagram of wordline voltage levels for different cases of the parameter of the transistor of the memory cell.

FIG. 6 is a diagram of wordline voltage levels for different cases of the parameter of the transistor of the memory cell. In this example, the parameter compensated may include the threshold voltage $V_{TH}$ of the n-type transistor of the memory cell 300. In case 1, the n-type transistor of the memory cell 300 is faster (than that of case 2), and therefore, the $V_{TH}$ of n-type transistor may be lower (than that of case 2). In case 2, the n-type transistor of the memory cell 300 is slower (than that of case 1), and therefore, the $V_{TH}$ of n-type transistor may be higher (than that of case 1).

When the voltage adjustment circuit 405_1 is disabled, the wordline voltage would be unadjusted at VDD. When the voltage adjustment circuit 405_1 is enabled, the passgate transistor 512 couples the wordline WL to the node N1 and therefore, to the gate of the pull-down transistor 514. The voltage on the node N1 would be the voltage of the WL_ADJ signal (i.e., VDD) subtracted by the $V_{TH}$ of the passgate transistor 512. The voltage on the node N1 turns on the pull-down transistor 514 to pull down the voltage on the wordline WL by the adjustment amount $V_{ADJ}$.

The $V_{TH}$ of the passgate transistor 512 is lower in case 1 (faster n-type transistor) than in case 2 (slower n-type transistor). Accordingly, the node N1 voltage is higher in case 1 than in case 2. As a result, the pull-down transistor 514 is turned on stronger in case 1 than in case 2, and the wordline voltage is pull-down more (e.g., $V_{ADJ}$ is higher) in case 1 than in case 2. The difference in the pulling-down of the wordline voltages in case 1 and case 2 is further expanded because of the lower $V_{TH}$ of the pull-down transistor 514 (which allows to the pull-down transistor 514 to turn on even stronger in case 1 than in case 2).

Figure 7:
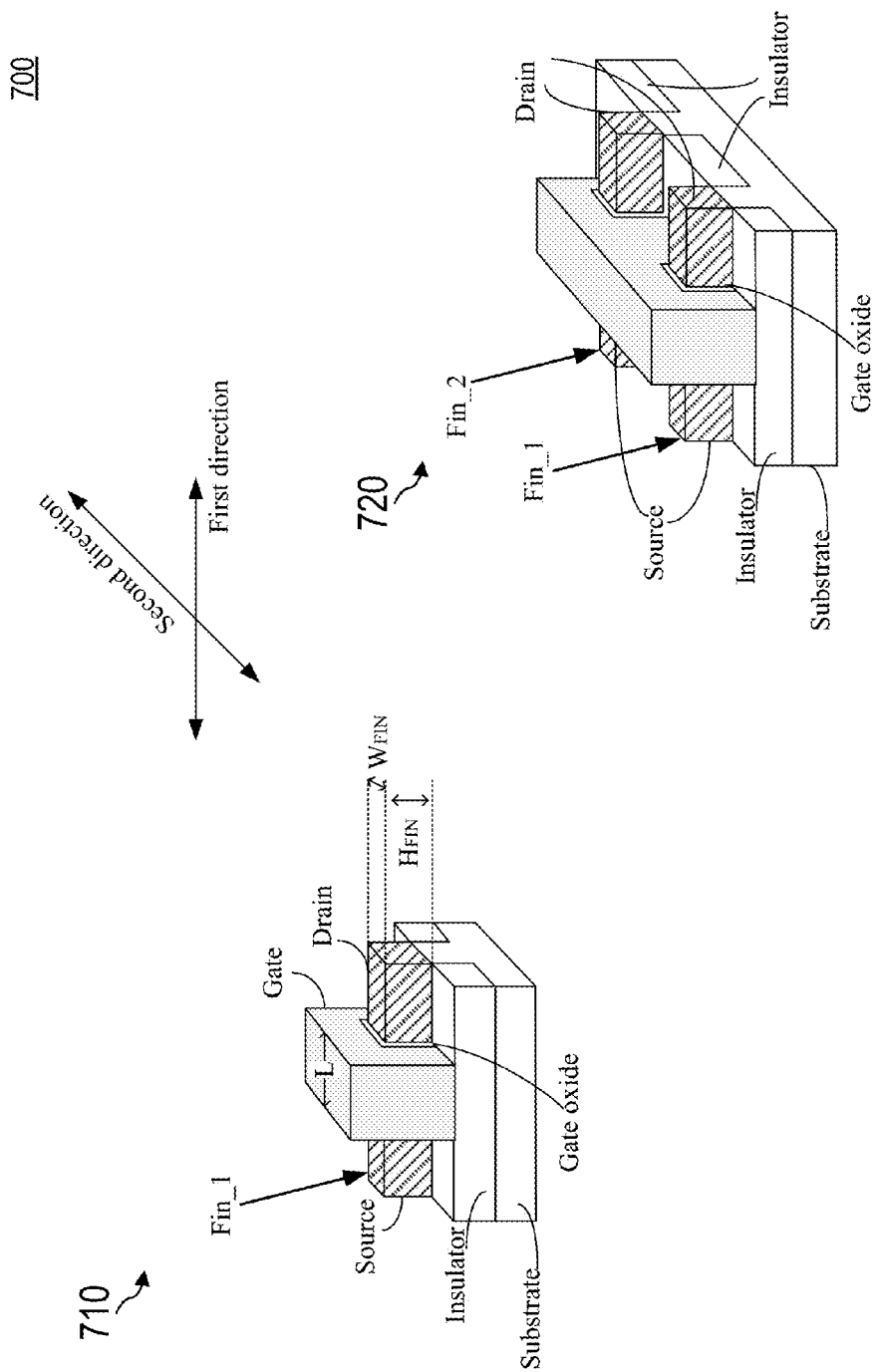
FIG. 7 is a diagram of a perspective view of a physical implementation of an exemplary transistor.

FIG. 7 is a diagram of a perspective view of a physical implementation of an exemplary transistor. In some examples, the SRAM 400 may be implemented in finFET technology. In finFET technology, the transistor is fabricated in a vertical direction. Transistor 710 illustrates a transistor of a single fin in finFET technology. Transistor 720 illustrates a transistor of multiple fins. A fin may be a 3-D source, drain, and gate structure and is disposed on the field oxide (as opposed to being planar with field oxide). The fin_1 of the transistor 710 may extend in a first direction. A gate oxide layer is disposed on the gate region of the fin. The gate of the transistor extends over the fin in the second direction. The transistor 710 has a gate length L, and a source/drain width of $W_{FIN}$ and a source/drain height of $H_{FIN}$. The transistor 720 is substantially the same as transistor 710, but with fins fin_1 and fin_2 and having a common gate over the fins. The drive strength of the transistor 720 would thus be almost twice the drive strength of the transistor 710. Thus, in finFET technology, the size of a transistor may be determined by a number of fins of the transistor.

In some examples, the memory cell 300 is implemented in finFET technology. The p-type transistors 306 and 310 and the n-type transistors 308 and 312 configured as a latch to stored data are implemented in a same number of fin or fins (e.g., each is a transistor of one fin as illustrated by transistor 710). The p-type transistors 306 and 310 and the n-type transistors 308 and 312 latching the stored data are thus implemented as transistors of the same size.

In some examples, the access transistors 314 and 318 may also be implemented with the same number of fin or fins as the latching transistors (e.g., each is a transistor of one fin as illustrated by transistor 710). The access transistors 314 and 318 are thus transistors of the same size as the latching transistors.

Figure 8:
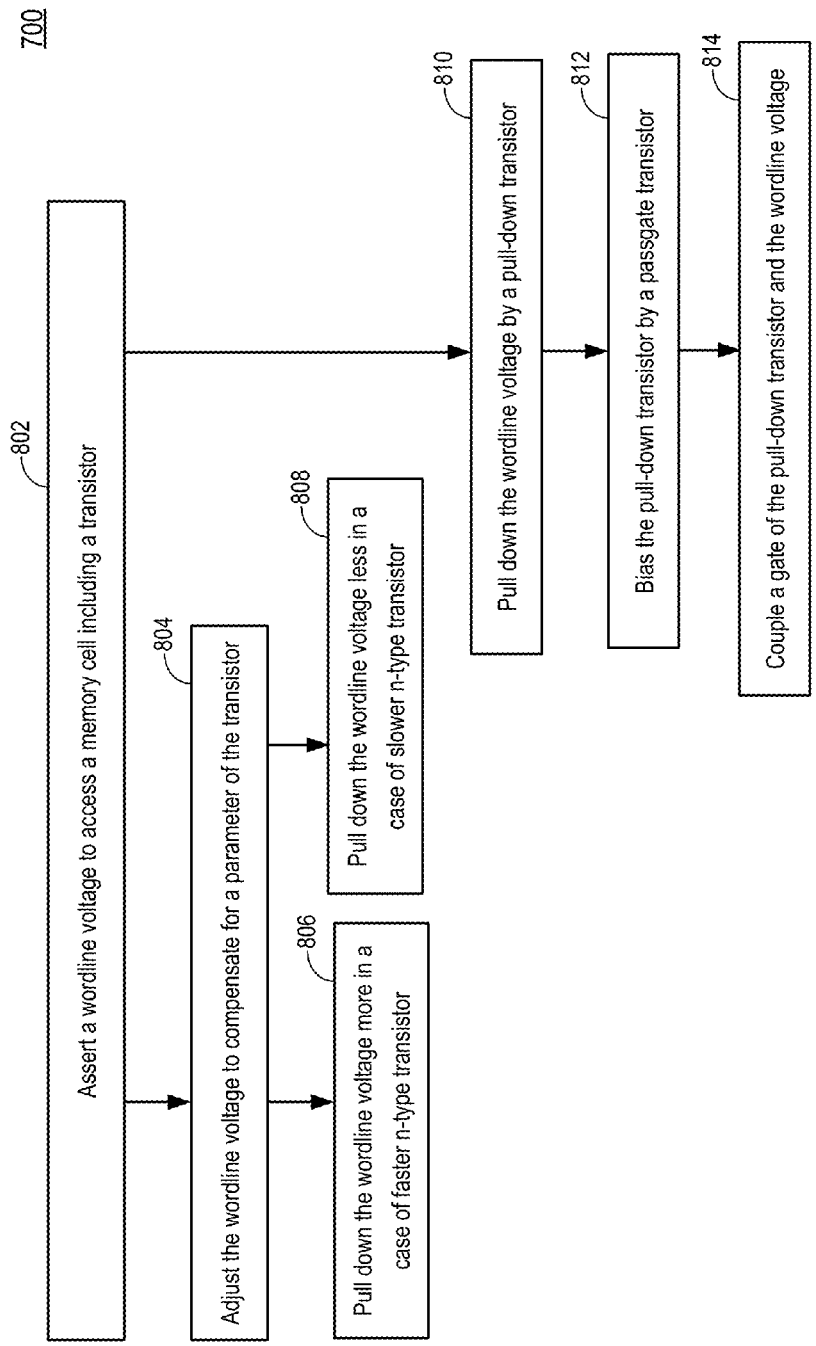
FIG. 8 is the flowchart of operations of the SRAM of FIG. 4.

FIG. 8 is the flowchart of operations of the SRAM of FIG. 4. The operations may be performed by, for example, circuits presented in FIGS. 4 and 5. At 802, a wordline voltage is asserted to access a memory cell including a transistor. Referring to FIG. 4, the wordline driver 405 asserts the wordline by outputting a voltage onto the wordline WL to access the memory cells 300. Referring to FIG. 3, the memory cell 300 may include p-type transistors 306 and 310 and n-type transistors 308 and 312 configured as a latch to store data. The access transistors 314 and 318 (also n-type) are coupled to the wordline WL to allow the bitline pair BL and BL_B to read or write the memory cell 300.

At 804, the wordline voltage is adjusted to compensate for a parameter of the transistor. In some examples, the parameter of the transistor may be a speed of the n-type transistor (e.g., of the access transistors 314 and 318) of the memory cell 300. The speed may include a transconductance and/or threshold voltage $V_{TH}$ of the n-type transistor. Referring to FIG. 5, the voltage adjustment circuit 405_1 adjusts or pulls down the voltage on the wordline WL based on the speed (e.g., transconductance and/or threshold voltage $V_{TH}$) of the n-type transistor.

At 806, the wordline voltage is pulled down more in a case of faster n-type transistor. At 808, the wordline voltage is pulled-down less in a case of slower n-type transistor. Referring to FIG. 5, when the voltage adjustment circuit 405_1 is enabled, the passgate transistor 512 couples the wordline WL to the node N1 and therefore, to the gate of the pull-down transistor 514. The voltage on the node N1 would be the voltage of the WL_ADJ signal (i.e., VDD) subtracted by the $V_{TH}$ of the passgate transistor 512. The voltage on the node N1 turns on the pull-down transistor 514 to pull down the voltage on the wordline WL by the adjustment amount $V_{ADJ}$.

The $V_{TH}$ of the passgate transistor 512 is lower in case 1 (faster n-type transistor) than in case 2 (slower n-type transistor). Accordingly, the node N1 voltage is higher in case 1 than in case 2. As a result, the pull-down transistor 514 is turned on stronger in case 1 than in case 2, and the wordline voltage is pull-down more ($V_{ADJ}$ is higher) in case 1 than in case 2. The difference in the pulling-down of the wordline voltages in case 1 and case 2 is further expanded because of the lower $V_{TH}$ of the pull-down transistor 514 (which allows to the pull-down transistor 514 to turn on even stronger in case 1 than in case 2.

At 810, the wordline voltage is pulled down by a pull-down transistor. At 812, the pull-down transistor is biased by a passgate transistor. At 814, a gate of the pull-down transistor and the wordline voltage are coupled. Referring to FIG. 5, the pull-down transistor 514 pulls down the voltage of the wordline WL. The passgate transistor 512 couples the voltage of the wordline WL to the gate of the pull-down transistor 514 (e.g., by way of the node N1). The passgate transistor 512 thus biases the pull-down transistor 514 to adjust the wordline voltage.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory, comprising:
   a memory cell comprising a transistor; and
      a wordline driver coupled to the memory cell by a wordline, the wordline driver being configured to adjust a voltage level of the wordline,
      wherein the wordline driver further comprises a pull-down transistor coupled to the wordline to adjust the voltage level and a passgate transistor to bias the pull-down transistor, the pull-down transistor separate from a buffer driving the wordline.

2. The memory of claim 1, wherein the parameter comprises a speed of the transistor based on at least the transconductance of the transistor.

3. The memory of claim 2, wherein the transistor is an n-type transistor, and the wordline driver is further configured to pull down a voltage level of the wordline more in a case of faster n-type transistor, and to pull down the voltage level of the wordline less in a case of slower n-type transistor.

4. The memory of claim 2, wherein the parameter further comprises at least one of a threshold voltage of the transistor or a temperature of the transistor.

5. The memory of claim 1, wherein the pull-down transistor is directly coupled to the wordline to adjust the voltage level.

6. The memory of claim 5, wherein the passgate transistor is coupled between the wordline and a gate of the pull-down transistor.

7. The memory of claim 6, wherein the pull-down transistor comprises a gate, and wherein the passgate transistor is coupled between the wordline and the gate.

8. The memory of claim 7, wherein each of the pull-down transistor and passgate transistor comprises an n-channel transistor.

9. The memory of claim 1, wherein the memory cell comprises a latch and a bitline, and wherein the transistor comprises an access transistor coupling the bitline to the latch.

10. The memory of claim 9, wherein the latch comprises at least one p-type transistor and at least one n-type transistor, wherein the at least one p-type transistor and the at least one n-type transistor are of a same size.

11. The memory of claim 10, wherein the at least one p-type transistor, the at least one n-type transistor, and the access transistor comprise finFET transistors and comprise a same number of fin or fins.

12. A method for operating a memory, comprising:
   asserting a wordline voltage to access a memory cell comprising a transistor;
   adjusting the wordline voltage;
   pulling down the wordline voltage by a pull-down transistor, the pull-down transistor separate from a buffer driving the wordline; and
   biasing the pull-down transistor by a passgate transistor.

13. The method of claim 12, wherein the parameter comprises a speed of the transistor based on at least the transconductance of the transistor.

14. The method of claim 13, wherein the transistor is an n-type transistor, further comprises
   pulling down the wordline voltage more in a case of faster n-type transistor; and
   pulling down the wordline voltage less in a case of slower n-type transistor.

15. The method of claim 13, wherein the parameter further comprises at least one of a threshold voltage of the transistor or a temperature of the transistor.

16. The method of claim 12, wherein pulling down the wordline voltage by a pull-down transistor comprises pulling down the wordline voltage by a pull-down transistor directly coupled to the wordline.

17. The method of claim 16, wherein biasing the pull-down transistor by a passgate transistor comprises coupling the passgate transistor between the wordline and a gate of the pull-down transistor.

18. The method of claim 17, further comprising
   coupling, by the passgate transistor, a gate of the pull-down transistor and the wordline voltage.

19. The method of claim 18, wherein each of the pull-down transistor and passgate transistor comprises an n-channel transistor.

20. The method of claim 12, wherein the memory cell comprises a latch and a bitline, and wherein the transistor comprises an access transistor coupling the bitline to the latch.

21. The method of claim 20, wherein the latch comprises at least one p-type transistor and at least one n-type transistor, wherein the at least one p-type transistor and the at least one n-type transistor are of a same size.

22. The method of claim 21, wherein the at least one p-type transistor, the at least one n-type transistor, and the access transistor comprise finFET transistors and comprise a same number of fin or fins.

23. A memory, comprising:
   a memory cell; and
   a wordline driver coupled to the memory cell by a wordline, the wordline driver being configured to adjust a voltage level of the wordline based on a feedback of the wordline,
   wherein the wordline driver further comprises a pull-down transistor coupled to the wordline to adjust the voltage level and a passgate transistor to bias the pull-down transistor, the pull-down transistor separate from a buffer driving the wordline.

24. The memory of claim 23, wherein the pull-down transistor is configured to pull down a voltage level of the wordline, and wherein the pull-down transistor comprises a gate coupled to the wordline.

25. The memory of claim 24, wherein the gate of the pull-down transistor is electrically connected to the wordline to control the pulling down of the voltage level of the wordline.

26. The memory of claim 24, wherein the passgate transistor is coupled between the wordline and the gate.

27. The memory of claim 26, wherein the memory cell comprises a latch having at least one p-type transistor and at least one n-type transistor, wherein the at least one p-type transistor and the at least one n-type transistor are of a same size.

28. The memory of claim 27, wherein the memory cell further comprises an access transistor coupling the latch to a bitline, and wherein the at least one p-type transistor, the at least one n-type transistor, and the access transistor comprise finFET transistors and comprise a same number of fin or fins.

29. A memory, comprising:
   a memory cell comprising a transistor; and
   a wordline driver coupled to the memory cell by a wordline, the wordline driver being configured to adjust a voltage level of the wordline,
   wherein the wordline driver further comprises a pull-down transistor coupled to the wordline to adjust the voltage level and a passgate transistor to bias the pull-down transistor, wherein adjusting the voltage level of the wordline comprises pulling down the wordline when the wordline driver outputs a logic 1.

* * * * *